United States Patent
Won et al.

(10) Patent No.: US 11,221,702 B2
(45) Date of Patent: Jan. 11, 2022

(54) TOUCH DISPLAY DEVICE

(71) Applicant: LG Display Co., Ltd., Seoul (KR)

(72) Inventors: Sang-Hyuk Won, Gimpo-si (KR); Min-Joo Kim, Seoul (KR); Seon-Hee Lee, Incheon (KR)

(73) Assignee: LG DISPLAY CO., LTD, Seoul (KR)

(*) Notice: Subject to any disclaimer, the term of this patent is extended or adjusted under 35 U.S.C. 154(b) by 0 days.

(21) Appl. No.: 17/134,375

(22) Filed: Dec. 26, 2020

(65) Prior Publication Data

US 2021/0200364 A1 Jul. 1, 2021

(30) Foreign Application Priority Data

Dec. 27, 2019 (KR) ................ 10-2019-0176522

(51) Int. Cl.
| | |
|---|---|
| *G06F 3/041* | (2006.01) |
| *G06F 3/044* | (2006.01) |
| *H01L 27/32* | (2006.01) |
| *H01L 51/52* | (2006.01) |

(52) U.S. Cl.
CPC .......... *G06F 3/0412* (2013.01); *G06F 3/0446* (2019.05); *G06F 3/04164* (2019.05); *H01L 27/323* (2013.01); *H01L 27/3276* (2013.01); *H01L 51/5259* (2013.01); *G06F 2203/04111* (2013.01); *G06F 2203/04112* (2013.01)

(58) Field of Classification Search
CPC ............. H01L 27/323; H01L 27/3276; H01L 51/5259; G06F 3/0412; G06F 3/0446; G06F 3/04164; G06F 3/041
See application file for complete search history.

(56) References Cited

U.S. PATENT DOCUMENTS 10,642,394 B2 * 5/2020 Song ................. G06F 3/04164

* cited by examiner

*Primary Examiner* — Sardis F Azongha
(74) *Attorney, Agent, or Firm* — Polsinelli PC

(57) ABSTRACT

A touch display device includes a display unit including a plurality of pixels disposed in an active area, an encapsulation unit disposed on the display unit, the encapsulation unit being configured to seal the plurality of pixels, and a touch sensor unit including an organic buffer layer disposed on the encapsulation unit and a plurality of touch sensors disposed on the organic buffer layer in the active area, wherein the end of the organic buffer layer and the end of the encapsulation unit are disposed in a bezel area adjacent to the bezel area so as to have a stepped end profile, and a plurality of touch routing lines connected to the plurality of touch sensors of the touch sensor unit and disposed in the bezel area is disposed along the stepped end profile of the end of the organic buffer layer and the end of the encapsulation unit.

20 Claims, 7 Drawing Sheets

TOUCH DISPLAY DEVICE

CROSS-REFERENCE TO RELATED APPLICATION

This application claims the benefit of Korean Patent Application No. 10-2019-0176522 filed on Dec. 27, 2019, which is incorporated by reference in its entirety.

BACKGROUND

Field of the Disclosure

The present disclosure relates to a touch display device capable of improving product yield and product reliability while reducing manufacturing cost.

Description of the Background

A touch sensor configured to allow information to be input by user touch on the screen of a display is applied to various display devices, such as laptop computers, monitors, and electric home appliances, as well as portable information devices, such as smartphones and tablets.

Although a touch sensor is generally manufactured in the form of a touch panel, which is attached to a display panel, development has been conducted toward a system in which the touch sensor is mounted in the display panel in order to simplify a display device and to reduce manufacturing cost.

There is a necessity for a display device having a touch sensor mounted therein that is capable of improving product yield and product reliability while reducing manufacturing cost.

SUMMARY

Accordingly, the present disclosure is directed to a touch display device that substantially obviates one or more problems due to limitations and disadvantages of the prior art.

One or more aspects of the present disclosure provides a touch display device capable of improving product yield and product reliability while reducing manufacturing cost.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

A touch display device according to an aspect includes a display unit including a plurality of pixels disposed in an active area, an encapsulation unit disposed on the display unit, the encapsulation unit being configured to seal the plurality of pixels, and a touch sensor unit including an organic buffer layer disposed on the encapsulation unit and a plurality of touch sensors disposed on the organic buffer layer in the active area, wherein the end of the organic buffer layer and the end of the encapsulation unit are disposed in a bezel area adjacent to the bezel area so as to have a stepped end profile, and a plurality of touch routing lines connected to the plurality of touch sensors of the touch sensor unit and disposed in the bezel area is disposed along the stepped end profile of the end of the organic buffer layer and the end of the encapsulation unit.

Each of the touch routing lines may include an upper routing line disposed along the end of the organic buffer layer and a lower routing line disposed along the end of the encapsulation unit, and the upper routing line and the lower routing line may be connected to each other via a contact hole in at least one insulating layer belonging to the touch sensor unit.

The touch sensor unit may include a bridge metal layer and a sensor metal layer constituting the plurality of touch sensors, a touch insulating layer located between the bridge metal layer and a sensor metal layer, and a touch passivation layer on the sensor metal layer. The end profile of the touch insulating layer may be set according to the stepped end profile of the end of the organic buffer layer and the end of the encapsulation unit.

The upper routing line may be disposed on the touch insulating layer, the lower routing line may be disposed under the touch insulating layer, and the contact hole may be formed in the touch insulating layer.

The touch sensor unit may further include a touch buffer layer disposed under the bridge metal layer, the touch buffer layer being configured to cover the encapsulation unit, on which the organic buffer layer is formed. The end profile of the touch buffer layer may be set according to the stepped end profile of the end of the organic buffer layer and the end of the encapsulation unit.

The upper routing line may be disposed on the touch insulating layer, the lower routing line may be disposed under the touch buffer layer on the end of the encapsulation unit, and the contact hole may be formed in the touch insulating layer and the touch buffer layer.

The upper routing line may be disposed on the touch insulating layer, the lower routing line may be disposed on the touch buffer layer on the end of the encapsulation unit, and the contact hole may be formed in the touch insulating layer.

The contact hole may be located on the upper surface of the end of the encapsulation unit.

A touch pad connected to each touch routing line in the bezel area may include a lower touch pad connected to the touch routing line and an upper touch pad connected to the lower touch pad via a contact hole formed in at least one insulating layer of the touch sensor unit.

The lower touch pad may be formed of an identical metal on an identical layer to the lower routing line, the upper touch pad may be formed of an identical metal on an identical layer to the upper routing line, and the at least one insulating layer of the touch sensor unit may include the touch insulating layer or the touch insulating layer and the touch buffer layer.

A display pad connected to the display unit may include a lower display pad formed of an identical metal on an identical layer to a metal layer belonging to the display unit and an upper display pad connected to the lower display pad via a contact hole formed in at least one insulating layer of the touch sensor unit, and the upper display pad may be formed of an identical metal on an identical layer to the upper routing line.

The display pad may further includes an intermediate display pad formed of an identical metal on an identical layer to the lower routing line, the intermediate display pad being connected to the upper display pad via a contact hole in the display pad while covering the lower display pad.

The touch passivation layer may overlap the end of the organic buffer layer in the bezel area, may overlap a contact hole configured to interconnect the upper and lower routing lines, may partially overlap the end of the encapsulation unit, and may not overlap the display unit and a pad area of the touch senor unit.

The display unit may include a dam unit configured to restrict the end of an organic encapsulation layer belonging to the encapsulation unit, and the end of the touch passivation layer may be disposed further inwards than the dam unit while not overlapping the dam unit in the bezel area.

The second metal layer may include first and second touch electrodes constituting each touch sensor and a second bridge electrode configured to interconnect adjacent second touch electrodes, and the bridge metal layer may include a first bridge electrode configured to interconnect adjacent first touch electrodes. The first bridge electrode may partially overlap the second touch electrode or the second bridge electrode in the state in which the touch insulating layer is interposed therebetween. The first touch electrode, the second touch electrode, and at least one of the first bridge electrode or the second bridge electrode may have a mesh pattern shape overlapping a non-emissive area of each of the plurality of pixels. The second bridge electrode may have the mesh pattern shape, and the first bridge electrode may have a line pattern shape overlapping the non-emissive area.

The organic buffer layer may have a large thickness similar to the thickness of the encapsulation unit.

The planar area in which the organic buffer layer is disposed may be smaller than the planar area in which the encapsulation unit is disposed.

The encapsulation unit may be disposed in the active area and may extend to the bezel area so as to be disposed in the bezel area. The organic buffer layer may be disposed in the active area and may extend to the bezel area so as to be disposed in the bezel area, the end of the organic buffer layer being located further inwards than the end of the encapsulation unit.

The end of the organic buffer layer may have a portion of the upper surface of the organic buffer layer and a side surface having a thickness gradually decreasing from the upper surface of the organic buffer layer. The end of the encapsulation unit may have a portion of the upper surface of the encapsulation unit located further outwards than the end of the organic buffer layer and a side surface having a thickness gradually decreasing from the upper surface of the encapsulation unit.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
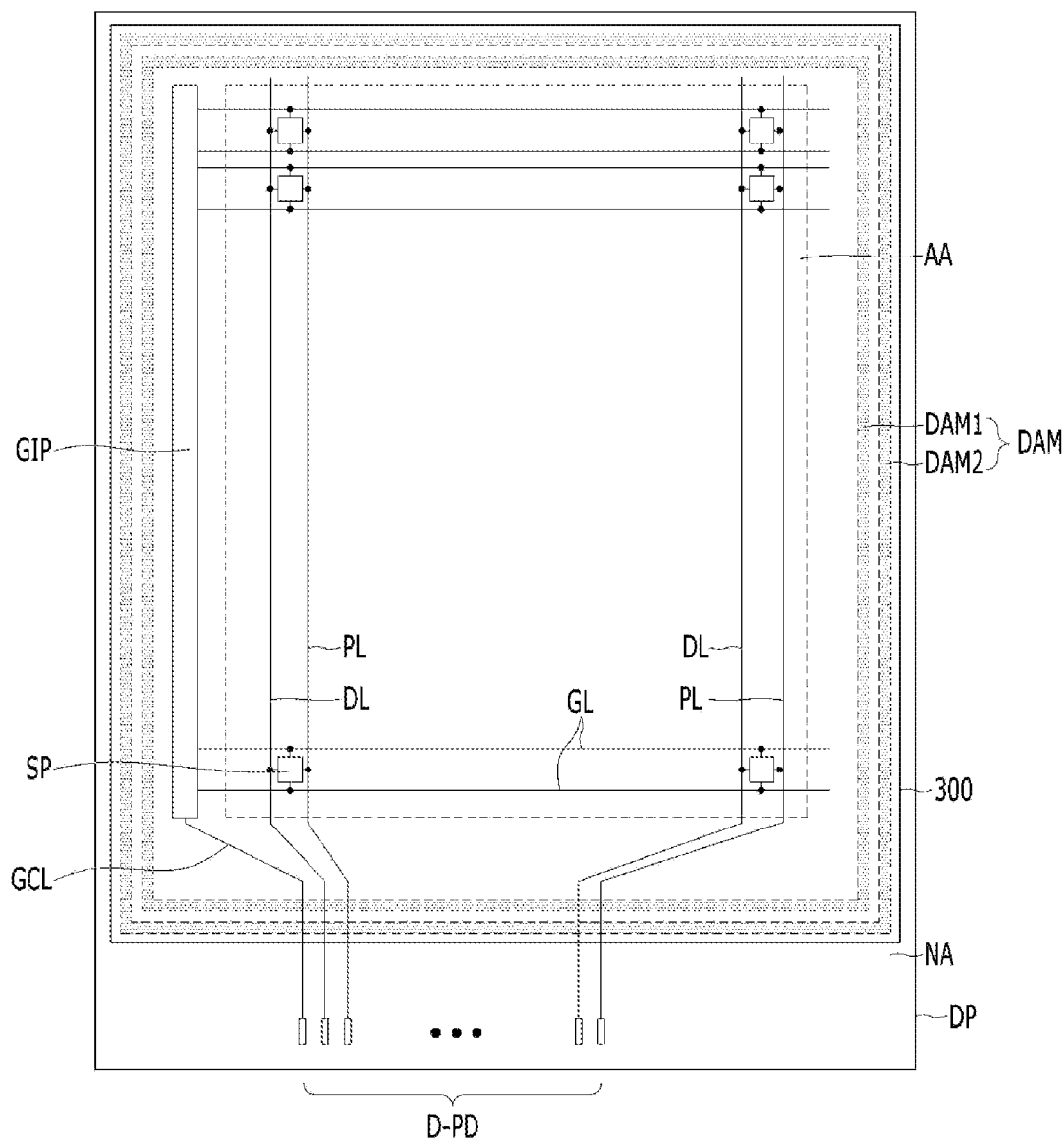
FIG. 1 is a plan view of a display unit and an encapsulation unit of a touch display device according to an aspect of the present disclosure.
Figure 2:
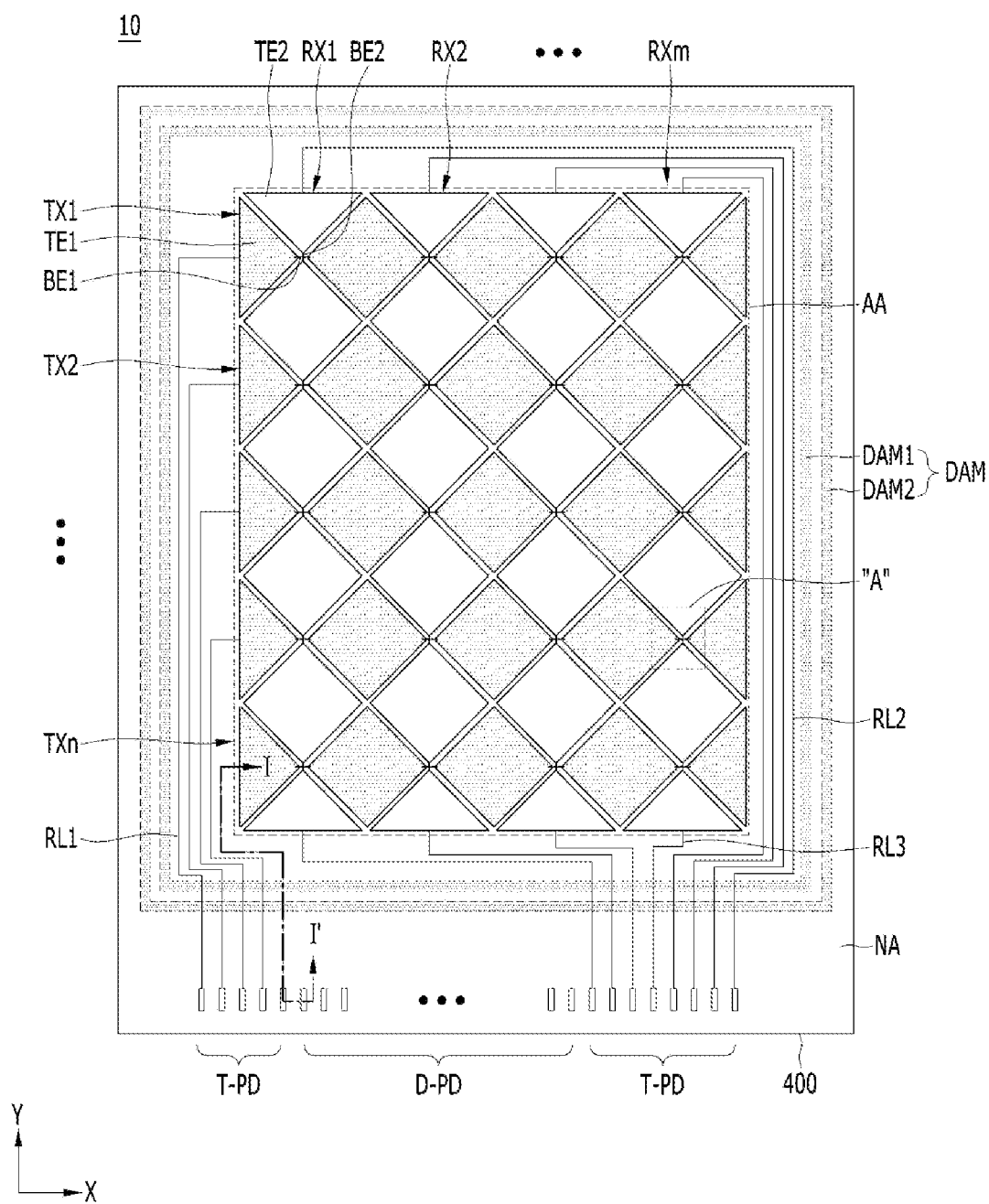
FIG. 2 is a plan view of a touch sensor unit of the touch display device according to the aspect of the present disclosure.

FIGS. 1 and 2 are plan views schematically showing a display unit, an encapsulation unit, and a touch sensor unit of a touch display device according to an aspect of the present disclosure.

Referring to FIGS. 1 and 2, the touch display device 10 according to the aspect includes an active area AA having image display and touch sensing functions and a bezel area NA located outside the active area AA. The active area AA may be referred to as a display area, a pixel matrix area, or a touch sensing area. The bezel area NA may be referred to as a non-active area, a non-display area, or a touch non-sensing area.

The touch display device 10 has a panel structure including a display unit DP configured such that a circuit element layer including a plurality of thin film transistors (TFTs) and a light-emitting element layer including a plurality of light-emitting elements are stacked in order to display an image, an encapsulation unit 300 disposed on the display unit DP so as to seal the light-emitting element layer, a touch sensor unit 400 disposed on the encapsulation unit 300 in the state in which a large-thickness organic buffer layer is interposed therebetween, the touch sensor unit having a touch sensing function. The end of the large-thickness organic buffer layer and the end of the large-thickness encapsulation unit 300 are disposed in a stepped shape so as to have a stepped end profile. In addition, the touch display device 10 may further include an optically functional film including a polarizing film attached to the touch sensor unit 400, an optically clear adhesive (OCA) 700, a cover substrate, and a protective film.

A pixel array including a plurality of subpixels SP configured to display an image and a plurality of wires is disposed in an active area AA of the display unit DP. The plurality of subpixels SP includes a red subpixel, a green subpixel, and a blue subpixel, and may further include a white subpixel configured to improve luminance. Each subpixel SP is connected to a plurality of signal lines including a gate line GL, a data line DL, and a power line PL. Each subpixel SP includes a light-emitting element and a pixel circuit configured to independently drive the light-emitting element. An organic light-emitting diode, a quantum-dot light-emitting diode, or an inorganic light-emitting diode may be used as the light-emitting element. Hereinafter, the organic light-emitting diode will be described by way of example. The pixel circuit may include a plurality of TFTs, at least including a drive TFT and a switching TFT, and a storage capacitor. The display unit DP has a structure in which a circuit element layer including a plurality of pixel circuits disposed in the active area AA and a light-emitting element layer including a plurality of light-emitting elements disposed in the active area AA are stacked.

A circuit element layer including a plurality of signal lines and a plurality of display pads D-PD connected to the active area AA is located in the bezel area NA of the display unit DP. The signal lines in the bezel area NA may include link lines and power supply lines connected to the signal lines GL, DL, and PL in the active area AA. A plurality of display pads D-PD configured to interconnect the signal lines of the bezel area NA and a display drive unit is disposed in a pad area provided at one side of the bezel area NA. Meanwhile, the display unit DP may include lower pads of the display pads D-PD and may have a structure in which the display unit is connected to upper pads disposed on the touch sensor unit 400, a description of which will follow.

A gate drive unit GIP configured to drive the plurality of gate lines GL in the active area AA may be disposed at one side or opposite sides of the bezel area NA of the display unit DP. The gate drive unit GIP, which includes a plurality of TFTs, may be formed in the circuit element layer together with the TFT array in the active area AA. The gate drive unit GIP may receive control signals from the display drive unit via signal lines GCL and the pads D-PD disposed in the bezel area NA.

The display drive unit may be mounted on the pad area in which the display pads D-PD are located or on a circuit film, and may be connected to the display pads D-PD via an anisotropic conductive film. The circuit film may be one of a chip on film (COF), a flexible printed circuit (FPC), and a flexible flat cable (FFC). The display drive unit may include a timing controller, a gamma voltage generation unit, and a data drive unit.

The encapsulation unit 300 disposed on the display unit DP may overlap the entirety of the active area AA, may extend to the bezel area NA, and may be disposed so as to overlap a dam unit DAM disposed in the bezel area NA. The encapsulation unit 300 may protect the light-emitting element layer of the display unit DP by sealing. The encapsulation unit 300 may include a structure in which a plurality of inorganic encapsulation layers configured to prevent the permeation of moisture and oxygen and at least one organic encapsulation layer configured to prevent the introduction or movement of particles are stacked. The encapsulation unit 300 has a structure in which an organic encapsulation layer having a large thickness sufficient to cover particles is disposed between inorganic encapsulation layers having a small thickness. The organic encapsulation layer may also be referred to as a particle cover layer (PCL).

The dam unit DAM may be disposed in the bezel area NA to restrict the end of the organic encapsulation layer of the encapsulation unit 300 and thus to prevent downward flow or collapse of the encapsulation unit 300. For example, the dam unit DAM may include a plurality of closed loop-shaped dams DAM1 and DAM2 configured to surround the active area AA of the display unit DP and an area including the gate drive unit GIP.

The touch sensor unit 400 on the encapsulation unit 300 may use a capacitance scheme in which a signal having capacitance variation by user touch reflected therein is provided to a touch drive unit. The touch sensor unit 400 may use a self-capacitance scheme in which a signal having capacitance variation of each touch electrode reflected therein is independently provided to the touch drive unit or a mutual-capacitance scheme in which a signal having capacitance variation between first and second touch electrodes reflected therein is provided to the touch drive unit.

Each of the plurality of touch electrodes constituting the self-capacitance type touch sensor unit 400 includes capacitance formed therein and thus is used as a self-capacitance touch sensor configured to sense a change in capacitance by user touch. The plurality of touch electrodes is individually connected to the plurality of touch lines. That is, each of the plurality of touch electrodes is electrically connected to one of the plurality of touch lines intersecting the touch electrodes, and is electrically isolated from the other touch lines. For example, an m-th touch electrode (m being a natural number) is electrically connected to an m-th touch line through at least one touch contact hole, and is electrically isolated from the other touch lines excluding the m-th touch line. An (m+1)-th touch electrode is electrically connected to an (m+1)-th touch line through at least one touch contact hole, and is electrically isolated from the other touch lines excluding the (m+1)-th touch line. Here, the touch electrode and the touch line may be formed on different layers in the state in which a touch insulating layer is interposed therebetween, and may be connected to each other via a contact hole formed through the touch insulating layer.

In the following aspects, a mutual-capacitance type touch sensor unit 400 will be described by way of example.

The touch sensor unit 400 on the encapsulation unit 300 includes a plurality of touch electrodes TE1 and TE2 and a plurality of bridge electrodes BE1 and BE2 disposed in the active area AA to provide capacitance type touch sensors. The touch sensor unit 400 includes a plurality of touch routing lines RL1, RL2, and RL3 and a plurality of touch pads T-PD disposed in the bezel area NA. When the touch sensor unit 400 is formed, the upper pads of the display pads D-PD may be formed of the same metal material on the same layer as upper pads of the touch pads T-PD, or may be formed of the same metal material on the same layer as the touch electrodes TE1 and TE2.

The touch sensor unit 400 includes a plurality of first touch electrode channels TX1 to TXn constituted by a plurality of first touch electrodes TE1 electrically connected to each other while being arranged in the active area AA in a first direction (an X-axis direction or a horizontal direction) and a plurality of second touch electrode channels RX1 to RXm constituted by a plurality of second touch electrodes TE2 connected to each other while being arranged in the active area AA in a second direction (a Y-axis direction or a vertical direction). A first touch electrode TE1 and a second touch electrode TE2 adjacent to each other may constitute a mutual-capacitance type touch sensor.

Each of the first touch electrodes TE1 arranged in the first direction X in each first touch electrode channel TXi (i=1 to n) is connected to a first touch electrode TE1 adjacent thereto via a first bridge electrode BE1. Each of the second touch electrodes TE2 arranged in the second direction Y in each second touch electrode channel RXi (i=1 to m) is connected to a second touch electrode TE2 adjacent thereto via a second bridge electrode BE2. The first touch electrodes TE1 may be referred to as transmission electrodes Tx, and the second touch electrodes TE2 may be referred to as reception electrodes Rx. The first touch electrode channels TX1 to TXn may be referred to as transmission channels, and the second touch electrode channels RX1 to RXm may be referred to as reception channels or readout channels. Each of the first and second touch electrodes TE1 and TE2 is mainly formed so as to have a diamond shape. Alternatively, each of the first and second touch electrodes TE1 and TE2 may be formed so as to have any of various other polygonal shapes.

The plurality of touch routing lines RL1, RL2, and RL3, connected to the touch electrode channels TX1 to TXn and RX1 to RXm in the active area AA, and the plurality of touch pads T-PD, connected to the plurality of touch routing lines RL1, RL2, and RL3, may be disposed in the bezel area NA of the touch sensor unit 400. The plurality of touch routing lines RL1, RL2, and RL3 may overlap the encapsulation unit 300 in the bezel area NA, which surrounds the active area AA. The touch drive unit may be mounted on a circuit film, and may be connected to the touch pads T-PD disposed in the bezel area NA via an anisotropic conductive film.

One-side ends of the plurality of first touch electrode channels TX1 to TXn disposed in the active area AA may be connected to the touch drive unit via the plurality of first touch routing lines RL1 and the touch pads T-PD disposed in the bezel area NA. The plurality of first touch routing lines RL1 may be individually connected to the touch pads T-PD disposed in a lower bezel area NA via one of left and right bezel areas NA and the lower bezel area NA.

Opposite-side ends of the plurality of second touch electrode channels RX1 to RXm disposed in the active area AA may be connected to the touch drive unit via the plurality of second touch routing lines RL2, the plurality of third touch routing lines RL3, and the touch pads T-PD disposed in the bezel area NA. Since the second touch electrode channels RX1 to RXm, which may be used as readout channels, are longer than the first touch electrode channels TX1 to TXn, opposite-side ends of each second touch electrode channel RXi may be connected to the touch drive unit via the second and third touch routing lines RL2 and RL3, whereby it is possible to reduce RC delay and to improve touch sensing performance.

For example, the plurality of second touch routing lines RL2 may be connected to one-side ends of the second touch electrode channels RX1 to RXm in an upper bezel area NA, and may be individually connected to the touch pads T-PD disposed in the lower bezel area NA via the other of the left and right bezel areas NA and the lower bezel area NA. The plurality of third touch routing lines RL3 may be connected to the other-side ends of the second touch electrode channels RX1 to RXm in the lower bezel area NA, and may be individually connected to the touch pads T-PD disposed in the lower bezel area NA via the lower bezel area NA.

The touch drive unit may drive the plurality of first touch electrode channels TX1 to TXn, may receive readout signals output from the plurality of second touch electrode channels RX1 to RXm, and may generate touch sensing data using the readout signals. For example, the touch drive unit may compare readout signals of two adjacent channels through a differential amplifier to generate a touch sensing signal indicating whether touch has been performed, may digitally convert the touch sensing signal into touch sensing data, and may output the touch sensing data to a touch controller. The touch controller may detect touch coordinates of the touch area based on the touch sensing data, and may provide the same to a host system.

In an aspect, the touch sensor unit 400 is disposed on the encapsulation unit 300 in the state in which an organic buffer layer having a large thickness similar to the thickness of the encapsulation unit 300 is interposed therebetween in the active area AA. Consequently, the manufacturing process is simpler than in a touch panel attachment method, whereby manufacturing cost is reduced. In addition, parasitic capacitance between the touch sensor unit 400 and the display unit DP is reduced, and therefore touch sensing performance is improved, whereby it is possible to improve product reliability.

The end of the organic buffer layer and the end of the encapsulation unit are disposed in a stepped shape, whereby the ends of the large-thickness organic buffer layer and the encapsulation unit have a stepped end profile. The touch routing lines RL1, RL2, and RL3 are disposed along the stepped end of the organic buffer layer and the encapsulation unit 300. In particular, each of the touch routing lines RL1, RL2, and RL3 may include a lower routing line disposed along the end of the encapsulation unit and an upper routing line disposed along the end of the organic buffer layer and connected to the lower routing line via a contact hole on the end of the encapsulation unit. Consequently, the touch routing lines RL1, RL2, and RL3 may be stably formed in the stepped end area of the organic buffer layer and the encapsulation unit without open-circuit defects, whereby it is possible to improve product yield and product reliability. The details thereof will be described later.

Figure 3:
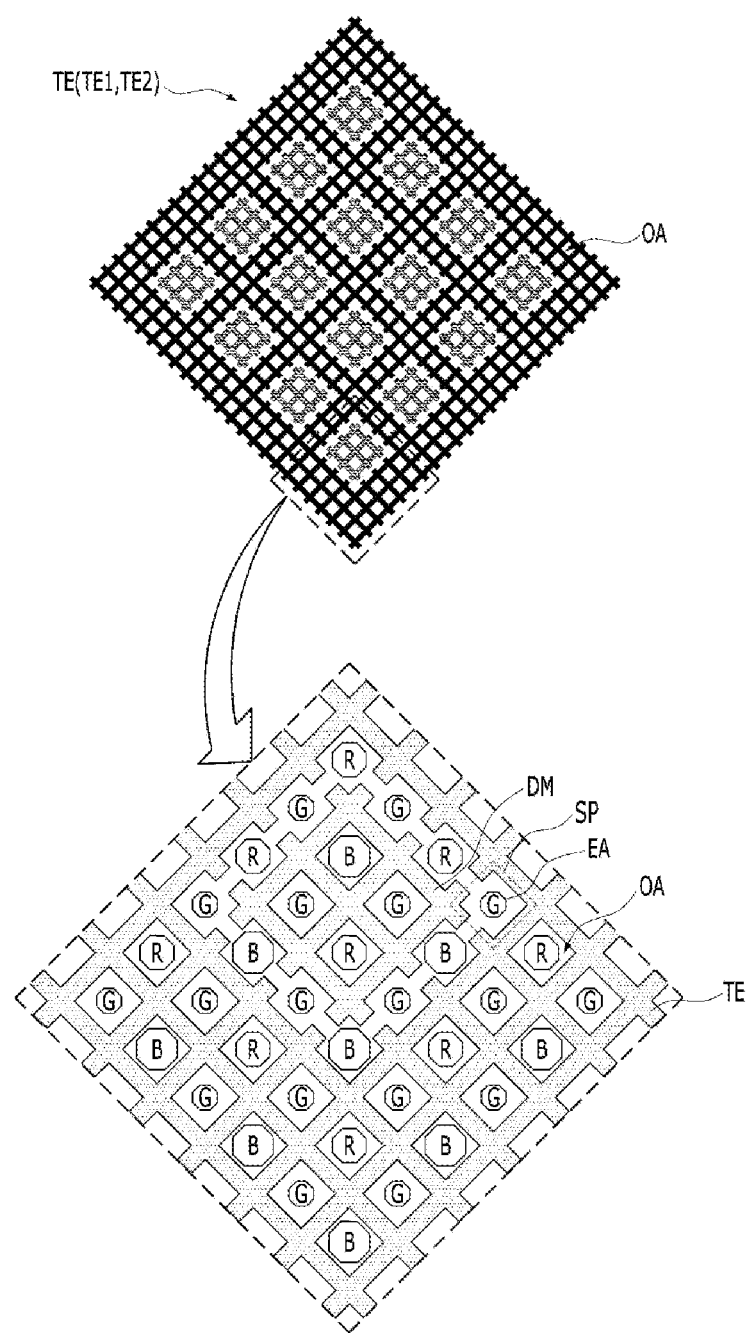
FIG. 3 is an enlarged plan view of a touch electrode according to an aspect of the present disclosure.
Figure 4:
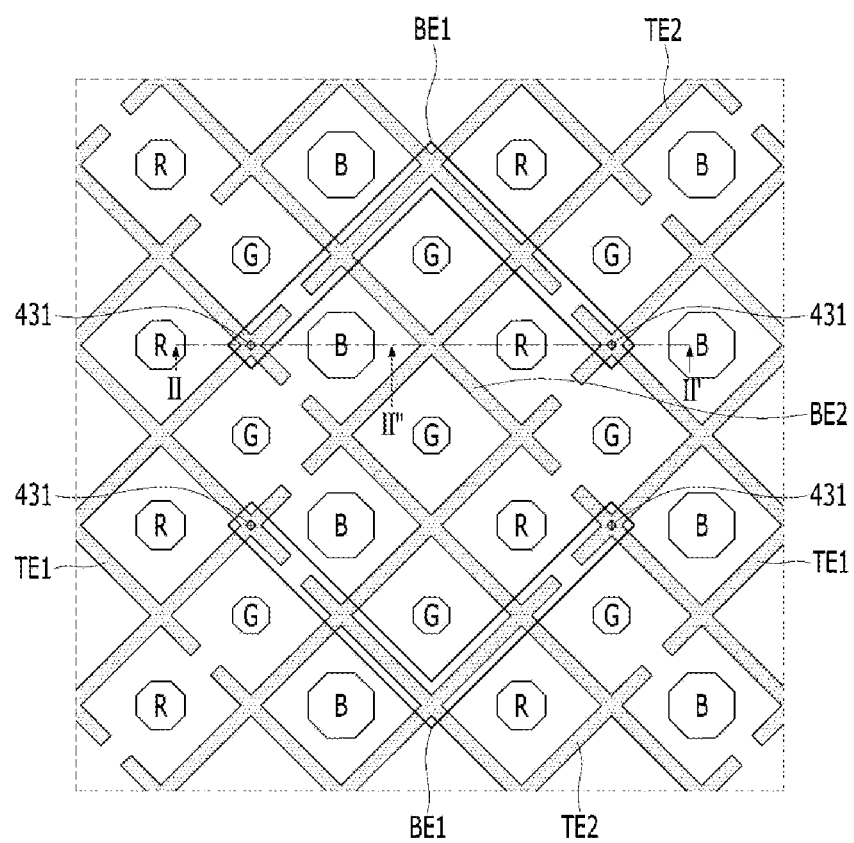
FIG. 4 is an enlarged plan view of bridge electrode portion A according to the aspect of the present disclosure shown in FIG. 2.

FIG. 3 is an enlarged plan view of a touch electrode according to an aspect, and FIG. 4 is an enlarged plan view of part A including bridge electrodes according to an aspect shown in FIG. 2.

Referring to FIGS. 3 and 4, a touch electrode TE applied to each of the first and second touch electrodes TE1 and TE2 has a diamond shape of a size equivalent to a plurality of subpixels SP, and has a mesh pattern shape overlapping a non-emissive area of each subpixel SP. The touch electrode TE may have one of various shapes, such as a quadrangular shape and a circular shape, in addition to the diamond shape. The mesh-pattern-shaped touch electrode TE may have a plurality of openings OA configured to expose the emissive areas EA of the plurality of subpixels SP, and the plurality of openings OA may be disposed in a matrix. Each of the first and second bridge electrodes BE1 and BE2 also has a line pattern or mesh pattern shape overlapping the non-emissive area of each subpixel SP. Consequently, the mesh-pattern-shaped touch electrodes TE1 and TE2 and the mesh-pattern-shaped or line-pattern-shaped bridge electrodes BE1 and BE2 are only disposed in the non-emissive areas of the subpixels SP, whereby it is possible to prevent deterioration in aperture ratio and transmittance of the pixels.

The first and second touch electrodes TE1 and TE2 are constituted by the same sensor metal layers, and are disposed so as to be spaced apart from each other. In the first and second bridge electrodes BE1 and BE2, bridge electrodes of one layer are constituted by the same sensor metal layers as the touch electrodes TE1 and TE2, and bridge electrodes of the other layer are constituted by bridge metal layers different from the touch electrodes TE1 and TE2. For example, a second bridge electrode BE2 interconnecting adjacent second touch electrodes TE2 may be constituted by a sensor metal layer integrated with the second touch electrodes TE2, and may have a mesh pattern shape. A first bridge electrode BE1 interconnecting adjacent first touch electrodes TE1 is constituted by a bridge metal layer having a touch insulating layer therebetween, overlaps a portion of each of the first touch electrodes TE1, and is connected to the first touch electrodes TE1 via a contact hole 431 in the touch insulating layer. The first bridge electrode BE1 may have a line pattern or mesh pattern shape in which the first bridge electrode partially overlaps the second bridge electrode BE2 or the second touch electrode TE in the state in which the touch insulating layer is interposed therebetween while being isolated from each other.

A mesh pattern of each touch electrode TE may further include at least one dummy pattern DM in which the mesh pattern is partially cut so as to electrically float, and the at least one dummy pattern DM may also have a mesh pattern shape. The floating dummy pattern DM may further reduce parasitic capacitance between the touch sensor unit 400 and the display unit DP overlapping each other in the state in which the encapsulation unit 300 and the touch buffer layer are interposed therebetween in the active area AA, whereby it is possible to improve touch sensing performance. For example, it is possible to reduce parasitic capacitance between the mesh pattern of the touch electrode TE and a common electrode of the light-emitting element layer through the floating dummy pattern DM.

The plurality of subpixels SP includes red (R), green (G), and blue (B) subpixels, and may further include a white (W) subpixel configured to improve luminance. It is not necessary for the emissive areas EA of the subpixels SP to have the same area. For example, the emissive areas EA of the subpixels SP may be smaller in order of blue (B)>red (R)>green (G).

Each subpixel SP includes a light-emitting element OLED disposed in the emissive area EA and a pixel circuit configured to independently drive the light-emitting element OLED, the pixel circuit being disposed over the emissive area EA and the non-emissive area, the pixel circuit including a plurality of TFTs and at least one capacitor. Various constructions, such as 2T1C (two TFTs and one capacitor), 3T1C (three TFTs and one capacitor), and 7T1C (seven TFTs and one capacitor), may be applied to the pixel circuit.

Figure 5:
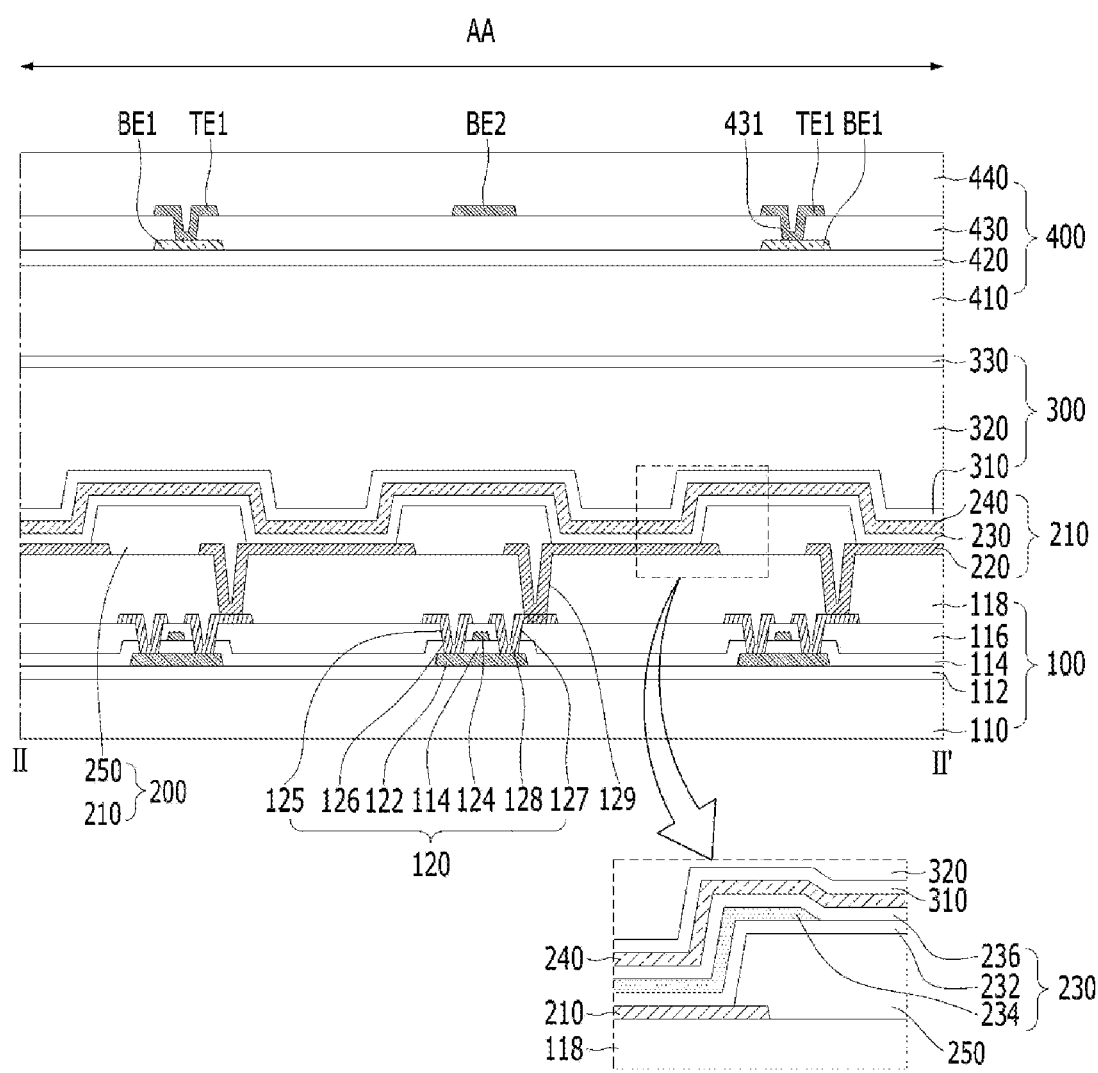
FIG. 5 is a cross-sectional view of the touch display device according to the aspect of the present disclosure taken along dot-long dash line II-II' of FIG. 4.
Figure 6:
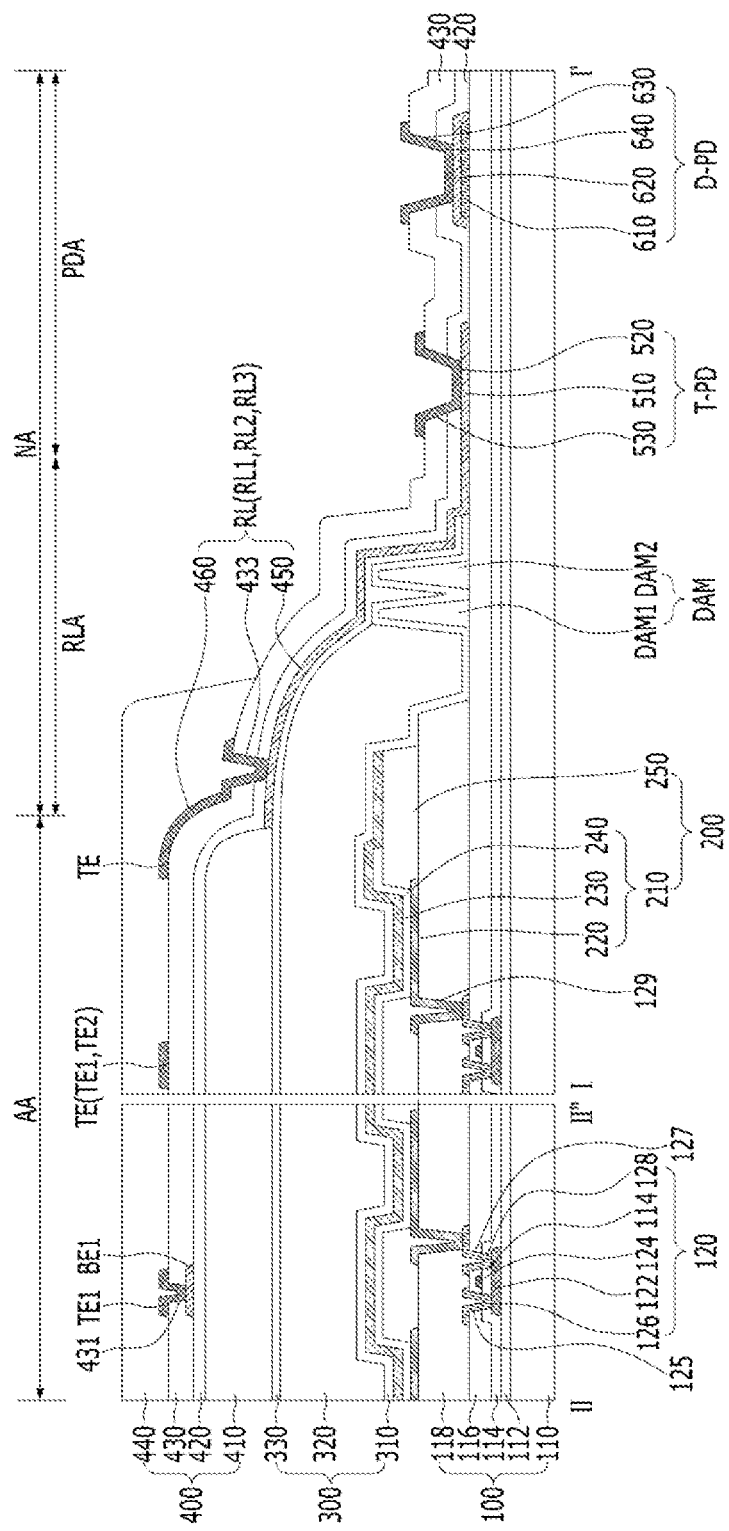
FIG. 6 is a cross-sectional view of the touch display device according to the aspect of the present disclosure taken along dot-long dash line II-II' of FIG. 4 and dot-long dash line I-I' of FIG. 2.
Figure 7:
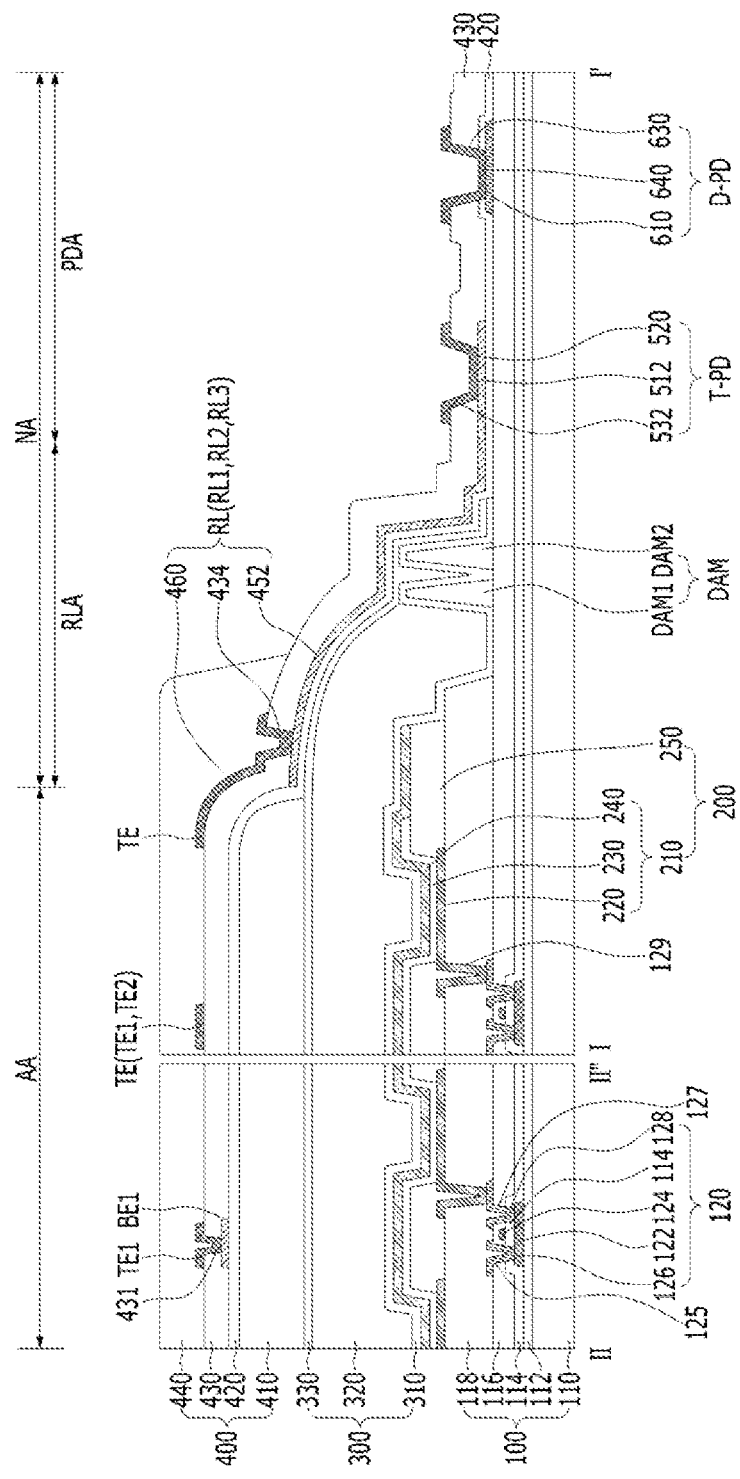
FIG. 7 is a cross-sectional view of the touch display device according to the aspect of the present disclosure taken along dot-long dash line II-II' of FIG. 4 and dot-long dash line I-I' of FIG. 2.

FIG. 5 is a cross-sectional view of the touch display device according to the aspect taken along dot-long dash line II-II' of FIG. 4, and each of FIGS. 6 and 7 is a cross-sectional view of the touch display device according to the aspect taken along dot-long dash line II-II' of FIG. 4 and dot-long dash line I-I' of FIG. 2.

Referring to FIGS. 5 to 7, the touch display device includes a circuit element layer 100 including a plurality of TFTs 120, a light-emitting element layer 200 including a plurality of light-emitting elements 210 disposed on the circuit element layer 100, an encapsulation unit 300 disposed on the circuit element layer 100 so as to seal the light-emitting element layer 200, and a touch sensor unit 400 including a plurality of touch sensors disposed on the encapsulation unit 300 in the state in which touch buffer layers are interposed therebetween.

The circuit element layer 100 includes a plurality of TFTs 120 disposed on a base substrate 110, the plurality of TFTs 120 is included in each pixel in the active area AA, and a drive circuit, such as a gate drive unit, disposed in the bezel area NA may be further included. The circuit element layer 100 further includes a plurality of wires connected to the plurality of TFTs 120 and a storage capacitor. However, FIGS. 5 to 7 typically show a drive TFT 120 connected to a light emitting element 210 in each subpixel SP.

The base substrate 110 may include a plastic substrate or a glass substrate. The plastic substrate may be formed of a flexible material. For example, the base substrate 110 may include at least one of an acrylic-based resin, an epoxy-based resin, a siloxane-based rein, a polyimide-based resin, or a polyamide-based resin, which is an organic insulating material.

A buffer layer 112 may be disposed between the base substrate 110 and the plurality of TFTs 120. The buffer layer 112 may prevent impurities, such as hydrogen, from being introduced into a semiconductor layer 122 of the TFT 120 through the base substrate 110. The buffer layer 112 may include an organic insulating material or an inorganic insulating material. For example, the buffer layer 112 may include an oxide-based insulating material, such as silicon oxide (SiOx) or aluminum oxide ($Al_2O_3$). Meanwhile, a barrier layer capable of preventing introduction of foreign matter may be further disposed between the base substrate 110 and the buffer layer 112. The buffer layer 112 and the barrier layer are disposed in the active area AA and the bezel area NA.

Each of the plurality of TFTs 120 includes a semiconductor layer 122, a gate insulating layer 114, a gate electrode 124, an interlayer insulating layer 116, a first electrode 126, and a second electrode 128. One of the first electrode 126 and the second electrode 128 may be a source electrode, and the other may be a drain electrode.

The gate electrode 124, the first electrode 126, and the second electrode 128 of each TFT 120 may be formed in a single layer structure or a multilayer structure including one or an alloy of at least two of molybdenum (Mo), aluminum (Al), chromium (Cr), gold (Au), titanium (Ti), nickel (Ni), copper (Cu), neodymium (Nd), and tungsten (W).

The semiconductor layer 122 may be formed of one of an amorphous semiconductor material, a polycrystalline semiconductor material, and an oxide semiconductor material. Meanwhile, the drive TFT 120, which is one of the TFTs belonging to each pixel P, may include a polycrystalline semiconductor layer, and each of the other TFTs may include an oxide semiconductor layer.

Each of the gate insulating layer 114 and the interlayer insulating layer 116 may be formed in a single layer structure or a multilayer structure including at least one of an oxide-based insulating material or a nitride-based insulating material. The gate insulating layer 114 and the interlayer insulating layer 116 may be disposed in the active area AA and the bezel area NA.

The gate electrode 124 is disposed on the gate insulating layer 114, which covers the semiconductor layer 122, so as to overlap the semiconductor layer 122. The first electrode 126 and the second electrode 128 formed on the interlayer insulating layer 116, which covers the gate electrode 124, are connected to the semiconductor layer 122 via contact holes 125 and 127 formed in the interlayer insulating layer 116 and the gate insulating layer 114.

A light-shielding layer overlapping the semiconductor layer 122 to prevent external light from being incident on the semiconductor layer 122 may be further provided between the buffer layer 112 and the semiconductor layer 122. The light-shielding layer may be formed of a conductive material, and may serve as a lower gate electrode, which is one of dual gate electrodes overlapping the semiconductor layer 122 above and under the semiconductor layer 122.

The circuit element layer 100 further includes a planarization layer 118 configured to cover the TFT 120 and to provide a flat surface to the light-emitting element layer 200, and at least one insulating layer may be further disposed between the TFT 120 and the planarization layer 118. The planarization layer 118 has a contact hole 129, through which the second electrode 128 of the TFT 120 is exposed. The planarization layer 118 may be formed of an organic insulating material, and the organic insulating material may include one of the above organic insulating materials. The planarization layer 118 may be disposed in the active area AA, and may extend to a portion of the bezel area NA adjacent to the active area AA. Also, in the case in which a portion of the lower bezel area NA including the pad area is bent, the planarization layer 118 may be further disposed in the bent bezel area so as to overlap wires, whereby it is possible to reduce bending stress applied to the wires and to prevent open-circuit defects.

A light-emitting element layer 200 including a light-emitting element 210 and a bank 250 is formed on the planarization layer 118. The light-emitting element layer 200 may further include a spacer disposed on the bank 250. The light-emitting element layer 200 is disposed in the active area AA, and the bank 250 may extend to a portion of the bezel area NA.

The light-emitting element 210 may include a first electrode 220 connected to the TFT 120, a light-emitting stack 230, and a second electrode 240. One of the first electrode 220 and the second electrode 240 may be an anode, and the other may be a cathode. The first electrode 220 may be independently separated and disposed for each subpixel SP, and the second electrode 240 may be a common electrode that is commonly disposed in the plurality of subpixels SP and is connected along the surfaces of the bank 250 and the spacer.

The first electrode 220 is disposed on the planarization layer 118, and is connected to the second electrode 128 of the TFT 120 via the contact hole 129 formed through the planarization layer 118. The first electrode 220 may be formed in a structure including a plurality of conductive layers exhibiting high reflectance. For example, the first electrode 220 may be formed in a stack structure (Ti/Al/Ti) of aluminum (Al) and titanium (Ti), a stack structure (ITO/Al/ITO) of aluminum (Al) and indium tin oxide (ITO), or a stack structure (ITO/APC/ITO) of APC and ITO. APC is an alloy of silver (Ag), palladium (Pd), and copper (Cu).

A bank 250 which has an opening configured to expose the first electrode 220 and is configured to cover the end of the first electrode 220 is disposed on the planarization layer 118 having the first electrode 220 formed thereon. The opening of the bank 250 may be defined as an emissive area, and the area in which the bank 250 is disposed may be defined as a non-emissive area. The bank 250, which surrounds the emissive area, may be formed in a single layer structure or a double layer structure. A spacer having an opening wider than the opening of the bank 250 may be further disposed on the bank 250. The spacer may support a deposition mask when a light-emitting layer 234 of the light-emitting stack 230 is formed. Each of the bank 250 and the spacer may be formed of the above organic insulating material. The bank 250 includes a light-shielding material, whereby it is possible to prevent backlight bleeding between adjacent pixels and to inhibit reflection of external light.

The light-emitting stack 230 may be formed by stacking a hole control layer 232, a light-emitting layer 234, and an electron control layer 236 in that order or in reverse order. The hole control layer 232 and the electron control layer 236 are common layers that are commonly formed in the plurality of subpixels SP, and the light-emitting layer 234 may be independently formed in the emissive area of each subpixel SP. The hole control layer 232 may include at least a hole transport layer selected from between a hole injection layer and the hole transport layer, and the electron control layer 236 may include at least an electron transport layer selected from between the electron transport layer and an electron injection layer. The light-emitting layer 234 may generate one of red light, green light, and blue light, and may be formed in an emissive area of a corresponding subpixel SP through an opening of a fine metal mask (FMM), which is a deposition mask. The light-emitting layer 234 overlapping the first electrode 220 may be disposed so as to overlap the end of the bank 250.

Meanwhile, the light-emitting stack 230 may include a plurality of light-emitting stacks overlapping in the state in which a charge generation layer is interposed therebetween to generate white light, and the plurality of light-emitting stacks may be formed as a common layer that is commonly formed in the plurality of subpixels SP. A color filter layer configured to emit each of red light, green light, and blue light using white light may be further provided in an optical path along which white light is emitted from the light-emitting stack 230. The color filter layer may include a color filter overlapping the emissive area of each subpixel SP and a black matrix overlapping the non-emissive area, and may be disposed above or under the touch sensor unit 400. The color filter and the black matrix may absorb external light, whereby it is possible to inhibit reflection of external light and to improve external visibility.

The second electrode 240 is disposed on the light-emitting stack 230, and is also disposed on the bank 250 and the spacer, whereby the second electrode 240 may also be referred to a common electrode that is commonly formed in the plurality of subpixels SP. The second electrode 240 may be formed of a conductive material having high light transmittance or a semi-transmissive conductive material. For example, the second electrode 240 may be formed of a transparent conductive material, such as ITO or IZO. The second electrode 240 may be formed of a semi-transmissive metal material, such as magnesium (Mg), silver (Ag), or an alloy thereof. A capping layer may be further disposed on the second electrode 240 in order to improve light resonance and light emission efficiency of the light-emitting element 210. The second electrode 240 may be disposed over the entire active area AA, and may extend to the bezel area NA so as to be connected to a power supply line disposed on another layer in the bezel area NA.

The encapsulation unit 300 configured to seal the light-emitting element layer 200 may be disposed on the circuit element layer 100, whereby it is possible to prevent moisture or oxygen from permeating into the light-emitting element layer 200 and to prevent introduction or movement of foreign matter. The encapsulation unit 300 may have a stack structure in which n inorganic encapsulation layers 310 and 330 (n being an integer equal to or greater than 2) and (n−1) organic encapsulation layers 320 are alternately disposed. The inorganic encapsulation layers 310 and 330 may prevent permeation of external moisture or oxygen. The organic encapsulation layer 320 may serve to prevent introduction or movement of foreign matter and to alleviate stress between layers when the display panel is bent.

Before the encapsulation unit 300 is formed, a dam unit DAM formed of the same insulating material on the same layer as at least one insulating layer of the display unit DP is further disposed in the bezel area NA of the display unit DP. The dam unit DAM may prevent the liquid organic encapsulation layer 320 from spreading to the edge of the panel at the time of an inkjet process and to prevent the liquid organic encapsulation layer from spreading to the pad area of the lower bezel area. The dam unit DAM may be disposed in the bezel area NA so as to be spaced apart from the active area AA in order to surround the active area AA, and may overlap the encapsulation unit 300 disposed thereon.

The dam unit DAM may include a plurality of dams DAM1 and DAM2 disposed in the bezel area NA so as to be spaced apart from each other, and the plurality of dams DAM1 and DAM2 may have the same height or different heights. For example, the height of the second dam DAM2, which is disposed outside, may be greater than the height of the first dam DAM1, which is disposed inside. The plurality of dams DAM1 and DAM2 may be disposed on the insulating layers 112, 114, and 116 of the circuit element layer 100, and may overlap a power supply line of the circuit element layer 100 disposed in the bezel area NA. The plurality of dams DAM1 and DAM2 may be formed of the same insulating material on the same layer as at least one of the planarization layer 118, the bank 250, or the spacer, and may be formed in a single layer structure or a multiple stack structure thereof.

The encapsulation unit 300 has a stack structure in which the organic encapsulation layer 320 is disposed between the upper and lower inorganic encapsulation layers 310 and 330. The plurality of inorganic encapsulation layers 310 and 330 may be disposed in the active area AA, and may extend to the bezel area NA so as to cover the dam unit DAM. The organic encapsulation layer 320 may be disposed in the active area AA, and may extend to the bezel area NA so as not to overlap the dam unit DAM or to partially overlap the first dam DAM1 disposed inside. The inorganic encapsulation layers 310 and 330 are formed in a structure configured to entirely wrap the upper surface, the lower surface, and the side surface of the organic encapsulation layer 320, and contact each other at the edge of the bezel area NA that does not overlap the organic encapsulation layer 320.

Each of the plurality of inorganic encapsulation layers 310 and 330 is formed of an inorganic insulating material that can be processed in a low-temperature process, and the organic encapsulation layer 320 is formed of an organic insulating material that can be processed in the low-temperature process. The inorganic insulating material may include one of silicon nitride, silicon oxide, silicon oxynitride, and aluminum oxide. The organic insulating material may include one of the above-described organic insulating materials.

The touch sensor unit 400 is disposed on the encapsulation unit 300 in the state in which an organic buffer layer 410 is interposed therebetween. The touch sensor unit 400 includes a touch buffer layer 420, a bridge metal layer, a touch insulating layer 430, a sensor metal layer, and a touch passivation layer 440, which are sequentially stacked on the organic buffer layer 410. The touch buffer layer 420 may be omitted.

Each metal layer constituting the touch sensor unit 400 may be formed of an opaque metal material that exhibits high corrosion resistance, acid resistance, and conductivity, and may have a single layer structure or a multilayer structure. For example, each metal layer of the touch sensor unit 400 may be formed in a single layer structure or a multilayer structure including at least one of molybdenum (Mo), aluminum (Al), chromium (Cr), gold (Au), titanium (Ti), nickel (Ni), copper (Cu), neodymium (Nd), tungsten (W), or an alloy thereof. Each metal layer of the touch sensor unit 400 may be formed in a structure in which three metal layers are stacked, such as Ti/Al/Ti, Mo/Al/Mo, MoTi/Cu/MoTi, or Ti/Al/Mo.

Each of the organic buffer layer 410, the touch buffer layer 420, the touch insulating layer 430, and the touch passivation layer 440 may be formed of an insulating material that can be processed in the low-temperature process. The large-thickness organic buffer layer 410 may be formed of an organic insulating material having a low insulating constant of 1 to 3, and may include, for example, an acrylic-based resin, an epoxy-based resin, or a siloxane-based rein. Each of the small-thickness touch buffer layer 420 and the touch insulating layer 430 may be formed of an inorganic insulating material or an organic insulating material. The touch passivation layer 440 may be formed of an organic insulating material configured to provide a flat surface.

The thickness of the large-thickness organic buffer layer 410 may be greater than the thickness of the touch buffer layer 420, may be equal or similar to the thickness of the encapsulation unit 300 or the organic encapsulation layer 320 of the encapsulation unit 300, and may be less than the total thickness of the encapsulation unit 300.

The large-thickness organic buffer layer 410 is disposed on the encapsulation unit 300, and the small-thickness touch buffer layer 420 configured to cover the organic buffer layer 410 is disposed on the encapsulation unit 300, on which the organic buffer layer 410 is formed. The organic buffer layer 410 may be disposed in the active area AA, and may extend to the bezel area NA. The touch buffer layer 420 is disposed in the active area AA and the bezel area NA. The organic buffer layer 410 may have a large thickness similar to the thickness of the encapsulation unit 300. The large-thickness organic buffer layer 410 increases the distance between the touch sensor unit 400 and the display unit DP together with the large-thickness encapsulation unit 300, whereby parasitic capacitance is reduced. Consequently, it is possible to improve touch sensing performance and thus to improve product reliability.

The disposition area of the organic buffer layer 410 is less than the disposition area of the encapsulation unit 300. In the bezel area NA, the end of the organic buffer layer 410 is located further inwards than the end of the encapsulation unit 300 to form a stepped end together with the end of the encapsulation unit 300. The end of the organic buffer layer 410 and the end of the encapsulation unit 300 have a stepped end profile. The end of the encapsulation unit 300 has a side surface, the thickness of which gradually decreases from the upper surface thereof. The end of the organic buffer layer 410 has a side surface, the thickness of which gradually decreases from the upper surface thereof, and is located further inwards than the side surface of the encapsulation unit 300. The touch buffer layer 420 is disposed along the stepped end of the organic buffer layer 410 and the encapsulation unit 300, and therefore the touch buffer layer 420 has a stepped end profile defined by the end of the organic buffer layer 410 and the end of the encapsulation unit 300.

The bridge metal layer is disposed on the touch buffer layer 420. The bridge metal layer includes a plurality of bridge electrodes BE1 disposed in the active area AA. As shown in FIG. 7, the bridge metal layer may further include a lower routing line 452 of each touch routing line RL disposed in the bezel area NA and a lower touch pad 512 of each touch pad T-PD. The lower routing line 452 is disposed in a routing area RLA of the bezel area NA, and is connected to the lower touch pad 512 disposed in the pad area PDA. The lower routing line 452 may be disposed on the surface of the touch buffer layer 420 following the end profile of the encapsulation unit 300 in the routing area RLA.

Meanwhile, a lower rouging line 450 and a lower touch pad 510 shown in FIG. 6 may be formed as a metal layer different from the first bridge electrode BE1, i.e. an additional metal layer under the touch buffer layer 420. The lower routing line 450 under the touch buffer layer 420 may be disposed along the end profile of the encapsulation unit 300 in the routing area RLA, and may extend to the outside of the encapsulation unit 300 so as to be disposed between the touch buffer layer 420 and the interlayer insulating layer 116. The lower touch pad 510 connected to the lower rouging line 450 may be disposed between the touch buffer layer 420 and the interlayer insulating layer 116 in the pad area PDA.

The touch insulating layer 430 configured to cover the bridge metal layer is disposed on the touch buffer layer 420. The touch insulating layer 430 is disposed in the active area AA and the bezel area NA. The touch insulating layer 430 has a stepped end profile following the stepped end of the ends of the touch buffer layers 410 and 420 and the end of the encapsulation unit 300. A plurality of contact holes 431, 434, 433, 530, 630, and 532 is formed in the touch insulating layer 430.

The sensor metal layer is disposed on the touch insulating layer 430. The sensor metal layer includes touch electrodes TE1 and TE2 and a bridge electrode BE2 disposed in the active area AA, and includes an upper routing line 460 of each touch routing line RL disposed in the routing area RLA of the bezel area NA and an upper touch pad 520 disposed in the pad area PDA of the bezel area NA. The sensor metal layer may further include an upper display pad 640 disposed in the pad area PDA of the bezel area NA.

The first touch electrode TE1 is connected to the first bridge electrode BE1 via a contact hole 431 formed in the touch insulating layer 430. The upper routing line 460 connected to one of the first and second touch electrodes TE1 and TE2 is connected to the lower routing line 450 or 452, which is disposed along the surface of the touch insulating layer 430 following the end profile of the organic buffer layer 410 and is located on the upper surface of the end of the encapsulation unit 300, while overlapping the lower routing line. On the upper surface of the end of the encapsulation unit 300, the upper routing line 460 may be connected to the lower routing line 452 via the contact hole 434 formed in the touch insulating layer 430, as shown in FIG. 7, or may be connected to the lower routing line 450 via the contact hole 433 formed in the touch insulating layer 430 and the touch buffer layer 420, as shown in FIG. 6.

As described above, the end of the organic buffer layer 410 and the end of the encapsulation unit 300 have a stepped end profile, each of the touch routing lines RL includes lower routing lines 450 and 452 disposed along the end of the encapsulation unit 300 and an upper routing line 460 disposed along the end of the organic buffer layer 410 and connected to the lower routing lines 450 and 452 via the contact holes 433 and 434 on the end of the encapsulation unit 300. Consequently, each touch routing line RL 1 may be stably formed in the stepped end area of the organic buffer layer 410 and the encapsulation unit 300 having a large step difference therebetween without open-circuit defects.

The touch passivation layer 440 configured to cover the sensor metal layer is disposed on the touch insulating layer 430. The touch passivation layer 440 may protect the touch sensor unit 400, and may provide a flat surface to upper layers, such as an optical film attached to the touch sensor unit 400. The touch passivation layer 440 may be disposed in the active area AA and may extend to a portion of the bezel area NA, but the pad area PDA is not disposed so as to be exposed for connection with the drive unit. In the bezel area NA, the touch passivation layer 440 may overlap the end of the organic buffer layer 410, may overlap the contact holes 433 and 434 configured to interconnect the upper routing line 460 and the lower routing lines 450 and 452, and may partially overlap the end of the encapsulation unit 300. In the bezel area NA, the end of the touch passivation layer 440 is disposed further inwards than the dam unit DAM and thus does not overlap the dam unit DAM.

A plurality of touch pads T-PD and a plurality of display pads D-PD are disposed in the pad area PDA located in the bezel area NA.

Each touch pad T-PD includes lower touch pads 510 and 512 connected to the touch routing line RL and an upper touch pad 520 connected to the lower touch pads 510 and 512 via the contact holes 530 and 532. As shown in FIG. 6, the upper touch pad 520 on the touch insulating layer 430 may be connected to the lower touch pad 510 on the interlayer insulating layer 116 via the contact hole 530 formed in the touch insulating layer 430 and the touch buffer layer 420. Meanwhile, as shown in FIG. 7, the upper touch pad 520 on the touch insulating layer 430 may be connected to the lower touch pad 512 on the touch buffer layer 420 via the contact hole 532 formed in the touch insulating layer 430.

Each display pad D-PD includes a lower display pad 610 connected to each link line disposed in the bezel area NA and an upper display pad 640 connected to the lower display pad 610 via the contact hole 630. The lower display pad 610 may be formed of the same metal material on the same layer as one metal layer belonging to the display unit DP, and the upper display pad 640 may be formed of the same metal material on the same layer as one metal layer belonging to the touch sensor unit 400. For example, the lower display pad 610 may be formed of the same metal material on the same layer as the first and second electrodes 126 and 128 of the TFT 120, and the upper display pad 640 may be formed of the same metal material on the same layer as the sensor metal layer. The contact hole 630 may be formed through at least one insulating layer belonging to the touch sensor unit 400. For example, the contact hole 630 may be formed through the touch buffer layer 420 and the touch insulating layer 430 located in the bezel area NA. Meanwhile, as shown in FIG. 6, the display pad D-PD may further include an intermediate display pad 620 located between the upper and lower display pads 610 and 640, as shown in FIG. 6. The intermediate display pad 620 may be formed of the same metal layer as the lower touch pad 510, and may have a structure configured to cover the lower display pad 610.

Meanwhile, a self-capacitance scheme may be applied to the touch sensor unit 400 according to the aspect.

As is apparent from the above description, in the touch display device according to the aspect, the touch sensor unit is disposed on the encapsulation unit in the active area in the state in which the large-thickness touch buffer layer is interposed therebetween. Consequently, the manufacturing process is simpler than in a touch panel attachment method, whereby manufacturing cost is reduced. In addition, parasitic capacitance between the touch sensor unit and the display unit is reduced, and therefore touch sensing performance is improved, whereby it is possible to improve product reliability.

In the touch display device according to the aspect, the end of the large-thickness touch buffer layer and the end of the large-thickness encapsulation unit have a stepped profile between the touch sensor unit and the display unit, each touch routing line has a structure in which the upper routing line disposed along the end of the touch buffer layer and the lower routing line disposed along the end of the encapsulation unit are connected to each other. Consequently, the touch routing line is formed without open-circuit defects in the area in which the step difference between the touch buffer layer and the encapsulation unit is large, whereby it is possible to improve product yield and product reliability.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various aspects described above can be combined to provide further aspects. These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A touch display device comprising:
a display unit comprising a plurality of pixels disposed in an active area;
an encapsulation unit disposed on the display unit and sealing the plurality of pixels; and
a touch sensor unit comprising an organic buffer layer disposed on the encapsulation unit and a plurality of touch sensors disposed on the organic buffer layer in the active area,
wherein the organic buffer layer and the encapsulation unit have an end portion disposed in a bezel area adjacent to the active area so as to have a stepped end profile; and
a plurality of touch routing lines connected to the plurality of touch sensors of the touch sensor unit and disposed in the bezel area is disposed along the stepped end profile of the end of the organic buffer layer and the end of the encapsulation unit.

2. The touch display device according to claim 1, wherein each of the touch routing lines comprises:
an upper routing line disposed along the end of the organic buffer layer; and
a lower routing line disposed along the end of the encapsulation unit,
wherein the upper routing line and the lower routing line are connected to each other via a contact hole in at least one insulating layer belonging to the touch sensor unit.

3. The touch display device according to claim 2, wherein the touch sensor unit comprises:
a bridge metal layer and a sensor metal layer constituting the plurality of touch sensors;
a touch insulating layer located between the bridge metal layer and a sensor metal layer; and
a touch passivation layer on the sensor metal layer; and
an end profile of the touch insulating layer is set according to the stepped end profile of the end of the organic buffer layer and the end of the encapsulation unit.

4. The touch display device according to claim 3, wherein the upper routing line is disposed on the touch insulating layer, and the lower routing line is disposed under the touch insulating layer, and
wherein the contact hole is formed in the touch insulating layer.

5. The touch display device according to claim 3, wherein the touch sensor unit further comprises a touch buffer layer disposed under the bridge metal layer, the touch buffer layer being configured to cover the encapsulation unit, on which the organic buffer layer is formed,
wherein an end profile of the touch buffer layer is set according to the stepped end profile of the end of the organic buffer layer and the end of the encapsulation unit.

6. The touch display device according to claim 5, wherein the upper routing line is disposed on the touch insulating layer, and the lower routing line is disposed under the touch buffer layer on the end of the encapsulation unit, and
wherein the contact hole is formed in the touch insulating layer and the touch buffer layer.

7. The touch display device according to claim 5, wherein the upper routing line is disposed on the touch insulating layer, and the lower routing line is disposed on the touch buffer layer on the end of the encapsulation unit, and
wherein the contact hole is formed in the touch insulating layer.

8. The touch display device according to claim 5, wherein a touch pad connected to each touch routing line in the bezel area comprises:
a lower touch pad connected to the touch routing line; and
an upper touch pad connected to the lower touch pad via a contact hole formed in at least one insulating layer of the touch sensor unit.

9. The touch display device according to claim 8, wherein the lower touch pad is formed of an identical metal on an identical layer to the lower routing line, and the upper touch pad is formed of an identical metal on an identical layer to the upper routing line, and
wherein the at least one insulating layer of the touch sensor unit comprises the touch insulating layer or the touch insulating layer and the touch buffer layer.

10. The touch display device according to claim 5, further comprising a display pad connected to the display unit,
wherein the display pad comprises:
a lower display pad formed of an identical metal on an identical layer to a metal layer belonging to the display unit; and
an upper display pad connected to the lower display pad via a contact hole formed in at least one insulating layer of the touch sensor unit, and
wherein the upper display pad is formed of an identical metal on an identical layer to the upper routing line.

11. The touch display device according to claim 10, wherein the display pad further comprises an intermediate display pad formed of an identical metal on an identical layer to the lower routing line, the intermediate display pad being connected to the upper display pad via a contact hole in the display pad while covering the lower display pad.

12. The touch display device according to claim 3, wherein the touch passivation layer overlaps with the end of the organic buffer layer in the bezel area, overlaps with a contact hole configured to interconnect the upper and lower routing lines, partially overlaps with the end of the encapsulation unit, and does not overlap with the display unit and a pad area of the touch senor unit.

13. The touch display device according to claim 12, wherein the display unit comprises a dam unit configured to restrict an end of an organic encapsulation layer belonging to the encapsulation unit, and
wherein an end of the touch passivation layer is disposed further inwards than the dam unit while not overlapping the dam unit in the bezel area.

14. The touch display device according to claim 3, wherein the second metal layer comprises first and second touch electrodes constituting each touch sensor and a second bridge electrode configured to interconnect adjacent second touch electrodes,
wherein the bridge metal layer comprises a first bridge electrode configured to interconnect adjacent first touch electrodes, wherein the first bridge electrode partially overlaps the second touch electrode or the second bridge electrode in a state in which the touch insulating layer is interposed therebetween, and wherein the first touch electrode, the second touch electrode, and at least one of the first bridge electrode or the second bridge electrode have a mesh pattern shape overlapping a non-emissive area of each of the plurality of pixels.

15. The touch display device according to claim 14, wherein the second bridge electrode has the mesh pattern shape, and the first bridge electrode has a line pattern shape overlapping the non-emissive area.

16. The touch display device according to claim 2, wherein the contact hole is located on an upper surface of the end of the encapsulation unit.

17. The touch display device according to claim 1, wherein the organic buffer layer has a large thickness similar to a thickness of the encapsulation unit.

18. The touch display device according to claim 1, wherein a planar area in which the organic buffer layer is disposed is smaller than a planar area in which the encapsulation unit is disposed.

19. The touch display device according to claim 1, wherein the encapsulation unit is disposed in the active area and extends to the bezel area so as to be disposed in the bezel area, and wherein the organic buffer layer is disposed in the active area and extends to the bezel area so as to be disposed in the bezel area, the end of the organic buffer layer being located further inwards than the end of the encapsulation unit.

20. The touch display device according to claim 19, wherein the end of the organic buffer layer has a portion of an upper surface of the organic buffer layer and a side surface having a thickness gradually decreasing from the upper surface of the organic buffer layer, and wherein the end of the encapsulation unit has a portion of an upper surface of the encapsulation unit located further outwards than the end of the organic buffer layer and a side surface having a thickness gradually decreasing from the upper surface of the encapsulation unit.

* * * * *